United States Patent [19]

Mahrla

[11] Patent Number: 4,511,912
[45] Date of Patent: Apr. 16, 1985

[54] SEMICONDUCTOR ELEMENT

[75] Inventor: Peter Mahrla, Munich, Fed. Rep. of Germany

[73] Assignee: Siemens Aktiengesellschaft, Berlin and Munich, Fed. Rep. of Germany

[21] Appl. No.: 290,332

[22] Filed: Aug. 5, 1981

[30] Foreign Application Priority Data

Sep. 19, 1980 [DE] Fed. Rep. of Germany ....... 3035462

[51] Int. Cl.$^3$ ............................................ H01L 29/72
[52] U.S. Cl. ....................................... 357/36; 357/55; 357/34; 357/35; 357/51
[58] Field of Search ..................... 357/36, 34, 51, 55, 357/35

[56] References Cited

U.S. PATENT DOCUMENTS 3,740,621  6/1973  Carley ................................. 357/36

FOREIGN PATENT DOCUMENTS 52-05274  1/1977  Japan ..................................... 357/34
52-43374  4/1977  Japan ..................................... 357/34

OTHER PUBLICATIONS

Uchizaki et al., "3-GHz 15-W Silicon Bipolar Transistors", IEEE Trans. Microwave Theory & Techniques, vol. MTT-27, No. 12, Dec. 1979, pp. 1038-1040.
Vacca, A. A., "The Case for Emitter-Coupled Logic", Electronics, pp. 48-50, Apr. 26, 1971.

Primary Examiner—Martin H. Edlow
Attorney, Agent, or Firm—Herbert L. Lerner; Laurence A. Greenberg

[57] ABSTRACT

Semiconductor element, including at least one bi-polar power transistor having parallel-connected transistor regions, active and contacted partial base zone regions, an emitter zone-base zone pn-junction, and base barrier resistances disposed between the active base regions at the emitter-base pn-junction and the contacted base regions, the greater part of the base current being conducted through the base barrier resistances and the voltage drop over the emitter region being small compared to the voltage between the active base region and the contacted base region.

3 Claims, 6 Drawing Figures

SEMICONDUCTOR ELEMENT

BACKGROUND AND SUMMARY

The invention relates to a semiconductor element including at least one bi-polar power transistor, having parallel-connected transistor regions and partial base regions arranged in such a manner, that between active base regions at the emitter-base p n-junction and contacted base regions, resistances in the form of so-called base barrier resistances are provided.

During the operation of bi-polar power transistors it is of great importance, with respect to the operational reliability and life of such a component, to achieve uniform current distribution over the transistor as a whole.

Due to the negative temperature coefficient of the base-emitter voltage, a lateral thermal instability exists in bi-polar power transistors.

The following relationship approximately applies for the dependence of the collector current density $J_C$ on the temperature T and the base-emitter-voltage $U_{BE}$:

$$J_C = J_{Co} X \exp((q \cdot U_{BE} - E_g)/kT)$$

where:
- $J_{CO}$ = Proportionality factor;
- q = Unit Charge (elementary charge);
- $E_g$ = band distance at silicone about 1.1 eV(energy level);

and
- k = Boltzmann constant.

If the temperature increases locally in a transistor relative to the surroundings, this results for a constant base-emitter voltage in an increase of the local current density according to the equation given above. This also leads to a local increase of the heat liberation as a power loss at the collector-base barrier layer and in the high-ohmic part of the collector. The resulting local temperature rise initiates a feedback coupling mechanism, resulting in a current restriction in the transistor. The high, local heat liberation associated therewith frequently causes irreversible damage to the transistor, leading to the failure of the component.

Such excessive temperatures must be prevented by a suitable current stabilization.

It is known, from the IEEE Journal of Solid State Circuits, Vol. SC-13, Nos. 3, pages 307 to 319, June 1978, to effect a current limitation in integrated power transistors by providing that the emitter zone is divided into several regions, whereby the part functioning mainly as an emitter is not contacted in the vicinity of the base connection, but is connected with contact-connected regions of the emitter zone through several part regions of the emitter zone which act as barrier resistances. This is done in such a configuration that each part-region of the effective emitter zone is associated with a barrier resistance and with a connection. An uniform current distribution over the individual partial regions of the effective emitter zone is achieved by the voltage drop over these barrier resistances, whereby the positive temperature coefficient of the emitter barrier resistance assists this regulation. Furthermore, because of the transistor construction described in the hereinafore-mentioned literature, a base barrier resistance is also provided besides the emitter barrier resistance. However, the base barrier resistance plays a minor role compared to the emitter barrier resistance. Furthermore, however, the insertion of emitter barrier resistances has the consequence that besides an additional power loss at the emitter barrier resistances, there is an increase in the collector-emitter-residual and saturation voltage.

It is accordingly an object of the invention to provide a semiconductor element and method for producing the same, which overcomes the hereinafore-mentioned disadvantages of the heretofore-known devices and methods of this general type, and to provide a power transistor, which on one hand has a sufficiently uniform current distribution, and on the other hand exhibits a very low saturation and residual voltage, and has a power loss which is as low as possible.

With the foregoing and other objects in view there is provided, in accordance with the invention, a semiconductor element, comprising at least one bi-polar power transistor having parallel-connected transistor regions, active and contact connected partial base zones, arranged in a particular as described in detail below manner, an emitter zone-base zone pn-junction, and base barrier resistances disposed between the active non contact-connected base zones at the emitter-base pn-junction and the contact-connected base zones, the greater part of the base current being conducted through the base barrier resistances and the voltage drop over the emitter region being small compared to the voltage between the active base region and the contact-connected base zone. This feature can be made especially advantageous in cases where the voltage between the active and non-contact-connected base zone and the contact-connected ("contacted") base zone is about twice as great, or greater, than the voltage drop over the emitter region.

Instead of emitter resistances between the effective emitter region and the contacted emitter region, base barrier resistances are provided between the contacted base zones and active base regions, so that the same or an analogous effect is achieved as with the emitter barrier resistances. In other words, a uniform distribution of the base current and accordingly also of the emitter current is achieved. A positive temperature coefficient of the base barrier resistances assists this measure.

By providing base barrier resistances instead of emitter barrier resistances, an additional power loss at the emitter barrier resistances as well as an increase of the collector-emitter residual voltage and saturation voltage can advantageously be avoided simultaneously.

In accordance with another feature of the invention, the base barrier resistances are zones of the same doping type as the base zone connected between the contacted and active base regions. These barrier resistances can be effected by diffusions and implantations which are already contained in the manufacturing procedure used for producing the other structural components in the integrated circuit, so that no additional process steps are required.

In accordance with a further featuer of the invention, the base barrier resistances are in the form of narrowed portions of the base zone between the active and contacted base regions. By this measure the barrier resistances in the base can be provided simply and without additional work expenditure.

In accordance with an added feature of the invention, the narrowed portions of the base zone are generated by a suitable doping mask configuration. Thus, barrier resistances can be created by a suitable geometry of the doping-masks alone.

In accordance with an additional feature of the invention, the narrowed portions of the base zone are generated by providing additional doped zones in the base zone.

In accordance with again another feature of the invention, the additional doped zones are emitter doped.

It is also advantageous if, in the manufacture of a power transistor, there is provided a method for producing a semiconductor element power transistor which comprises introducing n+-doped regions as a buried layer into a substrate, epitaxially depositing a layer above the buried layer and substrate, implanting isolation diffusions and n+-doped collector deep-diffusions in an optional sequence in the epitaxially deposited layer, subsequently introducing p-dopings as a base zone and base barrier resistances into the epitaxial layer subsequently introducing n+-dopings into the epitaxial layer as an emitter zone and to effect a good contact of the collector deep-diffusions, providing contact windows and providing conductor paths for making contact.

In accordance with a concomitant mode of the invention, which comprises providing the substrate in the form of p-doped silicon, and providing the layer above the buried layer and substrate in the form of n-doped silicon. This production method is especially suited for making integrated power transistors. The doping with respect to p and n can also be reversed.

Other features which are considered as characteristic for the invention are set forth below, in the drawings, and in the appended claims.

Although the invention is illustrated and described herein as embodied in a semiconductor element and method for producing the same, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings, in which.

In the following description of FIGS. 1 to 6, the same elements are designated with the same reference numbers, and for this reason the numbers explained for one figure are not explained again for all remaining figures.

DETAILED DESCRIPTION

Figure 1:
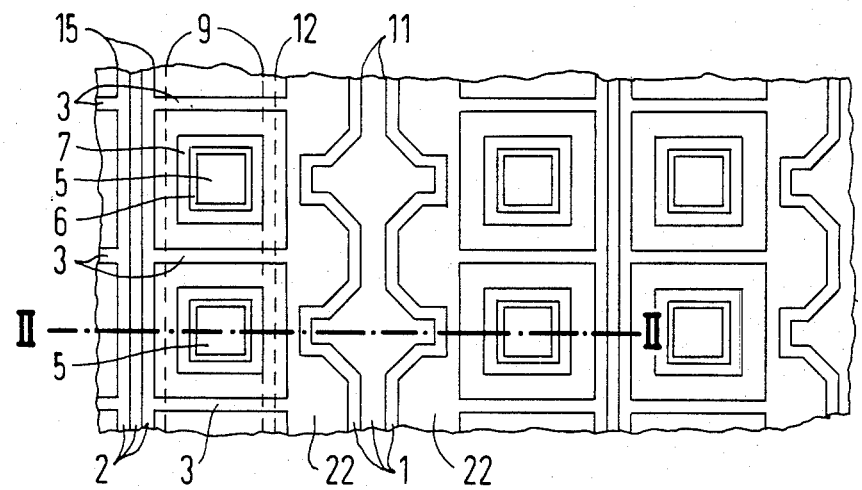
FIG. 1 is a fragmentary, diagrammatic, top plan view of a first embodiment of a semiconductor power transistor according to the invention.
Figure 2:
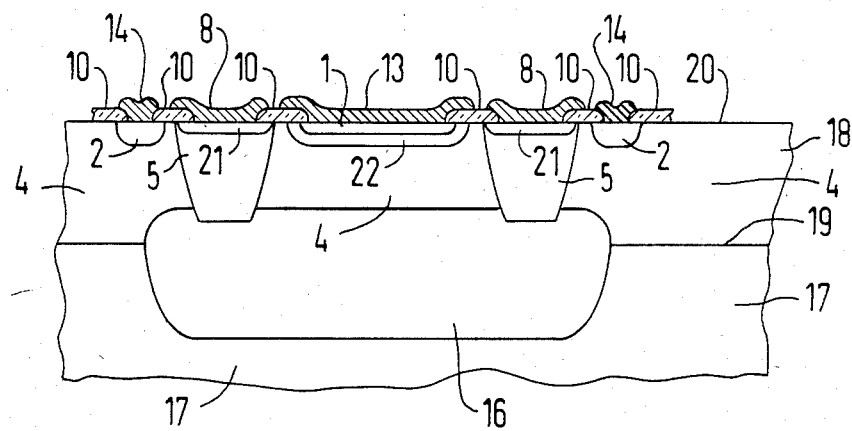
FIG. 2 is a cross-sectional view through the semiconductor power transistor according to FIG. 1, taken along the line II—II thereof.

Referring now to the figures of the drawing and first particularly to FIG. 1 thereof, there is seen a plan view onto a first embodiment of a semiconductor power transistor consisting of partial power transistors according to the invention, in integrated form. The emitter region 1 has superimposed thereon the emitter electrode 13 which is not shown in FIG. 1 for reasons of clarity. The boundary lines 12 of the emitter electrode are indicated by dotted lines. An emitter window having boundary lines 11 indicated by full lines, lies within the emitter region 1. The individual base zones 22 and 2 of which 22 is an active base region and 2 is a base contact region are connected together by the base barrier resistances 3 in such a manner that the contacted base contact regions 2 are always connected with the active non-contacted base regions 22 through the base-barrier resistances 3. The base barrier resistances 3, in the base of FIG. 1 and FIG. 2, are formed by bar-shaped, narrowed base regions. Base electrodes 14 are only indicated by boundary lines 15, for reasons of clarity. A buried 16 layer is connected by the collector deep diffusion contact regions 5 through the collector connections 7 with the collector conducting path which is indicated by the dotted boundary lines 9.

FIG. 2 represents a cross-section of the semiconductor power transistor according to FIG. 1, wherein FIG. 1 is cut along the dot-dash line II—II.

Buried layer regions 16 are doped in a substrate 17, which may be formed, for example, of saphire or a semiconductor material, especially silicon. An epitaxial layer 18 is deposited on the surface 19. The collector deep-diffusion contact regions 5 are implanted in the epitaxial layer 18 in such a way that they project downward into the buried layer 16. The collector region 4 is disposed above the buried layer 16 between the collector deep-diffusion regions 5. Above the collector zone 4 is the non-contacted part of the base region 22, which is connected with the contacted base zone 2 through the base barrier resistances 3 that are shown in FIG. 1. The contacting of the base region 2 is effected by the base electrode 14 zone. The emitter region 1 is disposed within the non-contacted base region 22 and the surface 20. The emitter region 1 is contacted by the emitter electrode 13. The collector electrodes 8 are provided for contacting the collector deep-diffusion regions 5. For obtaining a good contact between the collector conducting path (connector electrode) 8 and the collector deep-diffusion region (collector contact region) 5, additionally doped regions 21 in the collector deep-diffusion regions 5 are provided. The regions 21 have doping which generally corresponds to the emitter doping. Oxide layers 10 which are not shown for reasons of clarity in FIG. 1, are deposited for insulation purposes between the individual transistor regions and the required conducting paths 8, 13, 14 which lie above the transistor regions.

Figure 3:
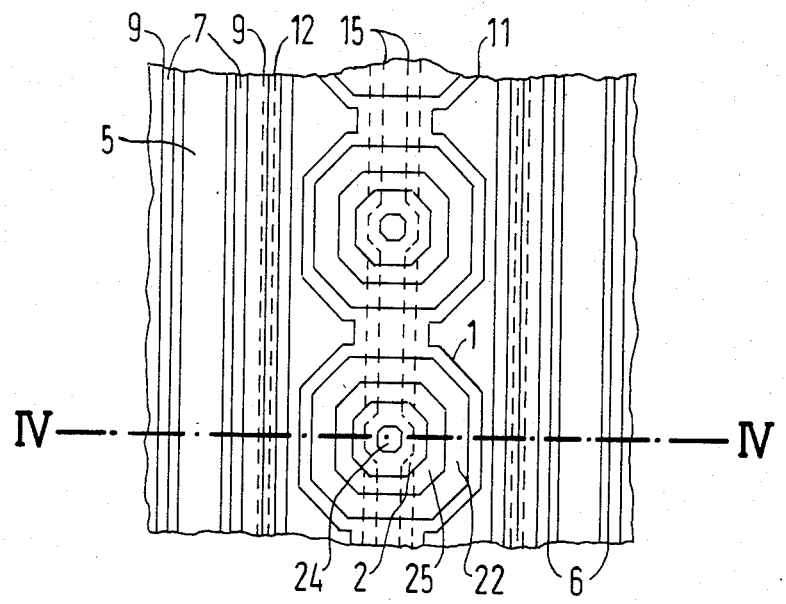
FIG. 3 is a fragmentary top plan view of a second embodiment of a semiconductor power transistor according to the invention.
Figure 4:
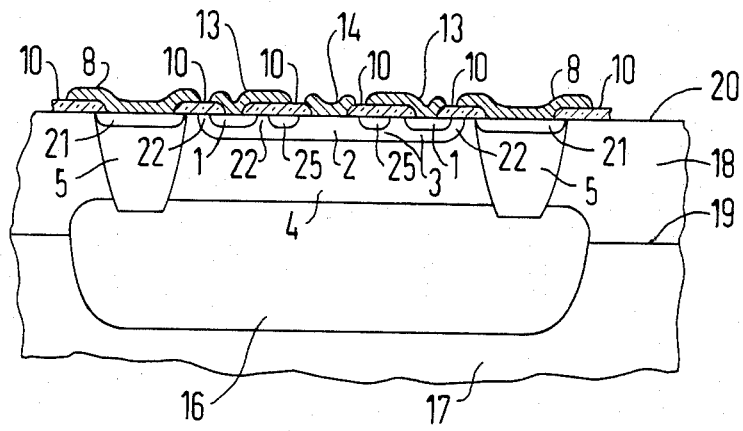
FIG. 4 is a fragmentary cross-sectional view through the semiconductor power transistor according to FIG. 3, taken along the line IV—IV thereof.

FIGS. 3 and 4 differ from FIG. 1 and FIG. 2 by the feature that the contacted base zone 2 is centrally disposed, while the contacted emitter zone 1 surrounds the zone 2 like a ring. A ring-shaped zone 25 is disposed between the contacted emitter zone 1 and the contacted base region 2. The region 25 generally has the same doping as the emitter, however it is not connected, as shown in FIG. 3 and FIG. 4, or it can be connected to the base potential. The base region is narrowed by the annular region 25. In this embodiment the base barrier resistances 3 are provided by the narrowed base zones 2 below the ring-shaped region 25. The base resistances 3, which in this arrangement are called base-pinch resistances, have an area resistance of about 5 K-ohm/cm$^2$.

Figure 5:
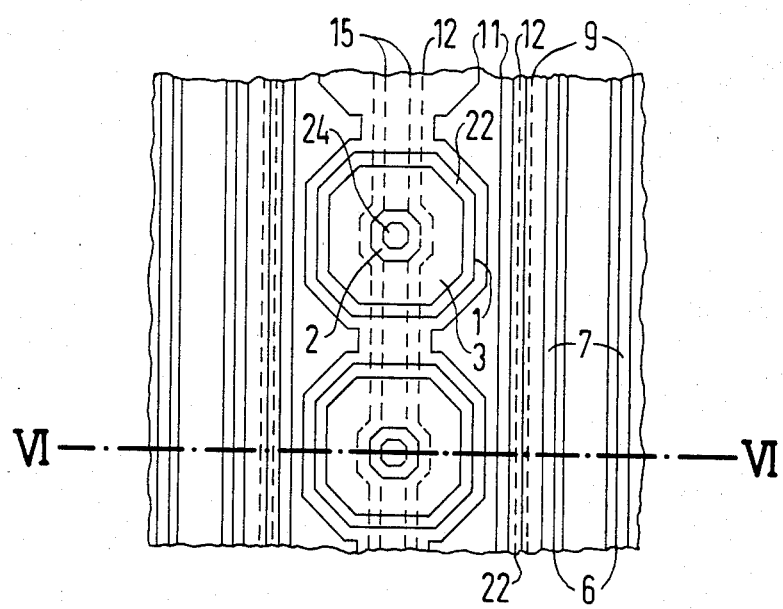
FIG. 5 is a plan view of a third embodiment of a semiconductor power transistor according to the invention.
Figure 6:
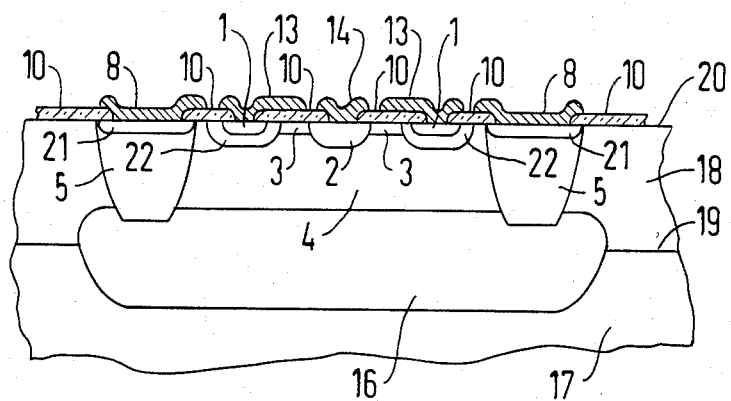
FIG. 6 is a fragmentary cross-sectional view through the semiconductor power transistor according to FIG. 5 taken along the line VI—VI thereof.

The typical embodiment according to FIG. 5 and FIG. 6 represents a transistor with a centrally disposed contacted base zone 2, which is surrounded in ring-fashion by the emitter zone 1. In this way the emitter zone 1 again surrounds a non-contacted base region 22. The non-contacted base region 22 and the contacted base zone 2 are connected to each other by the barrier resistances 3, which in this case are disposed in ring-fashion between the contacted base zone 2 and the non-contacted base zone 22. The barrier resistances 3 represent high-ohmic resistances of 2 K ohm/cm$^2$.

The reference numerals of FIGS. 1, 3 and 5 are given at one side of the axis of symmetry of the devices, in order not to confuse them with the associated conducting path boundary lines.

Silicon may be used as the semiconductor material for all three embodiments, and in this case the substrate 17 is, for example, p-doped, and the buried layer 16 is n+-doped, just as the regions 21 which serve for connecting the collector deep-diffusion regions 5 to the collector conducting paths 8 are doped n+. The collector 4, and also the whole epitaxial layer 18 are n-doped, the base zones 2, 22, and the base barrier resistances 3 are all p-doped. In the case of FIG. 6, the base barrier resistances 3 are made as implanted high-ohmic resistances. The emitter region 1, as well as the region 25 in FIG. 3 and FIG. 4 are n+-doped. In general, the p-doping can be effected by doping with boron, while the n and the n+ doping can be done by arsenic. However, other suitable doping means or semiconductor materials can also be used. Furthermore, the doping of the semiconductor power transistor according to the invention can also be effected by a mirror-like inversion with respect to the p and n-doping.

By using the base barrier resistances for current stabilization, the voltage drop along the base barrier resistances occurs not at the collector-emitter saturation voltage, but only at the control voltage between base and emitter connection. Through the use of base barrier resistances, disadvantageous positive temperature coefficients on the current amplification can be partly compensated in particular by the positive temperature coefficient of the base-resistance. A particularly strong temperature compensation is made possible by the use of base-pinch resistances, as shown in FIG. 3 and FIG. 4, because their positive temperatures coefficient in wide ranges lies clearly above the temperature coefficient of the current amplification. In this way, a temperature stabilization in the power transistor is additionally achieved, because at the hot places the collector current density and accordingly the liberation of heat is reduced by the increased pinches resistance.

The same structure can be provided in discrete power transistors, as shown in FIGS. 3 and 4, whereby the collector deep-diffusions are omitted.

The embodiment according to FIG. 5 and FIG. 6 also effects a compensation of the temperature coefficients of the associated current amplification because of the positive temperature coefficient of the implanted high-ohmic resistances. The structures according to FIG. 4 and FIG. 5 can also be realized in principle in doubly diffused discrete power transistors.

Semiconductor power transistors according to the invention can be especially advantageous for applications in the low frequency domain.

There are claimed:

1. Integrated power transistor arrangement with several bipolar parallel connected partial power transistors in which, on a semiconductor substrate an epitaxial layer is provided, which forms the partial power transistors in respective collector zones, in which, in the region of the border-surface between the semiconductor substrate and the epitaxial layer, is provided for each respective collector zone a buried layer zone, which projects all the way to collector contact regions, the collector contact regions reaching from the surface of the epitaxial layer facing away from the semiconductor substrate into the buried layer zone, and in which, in the epitaxial layer on the side facing away from the semiconductor substrate, a base zone is provided which is part of the partial power transistors and in the base zone is provided a common emitter zone for the partial power transistors; and in which is connected to each respective base a barrier resistance which is integrated with the base, the power transistor arrangement which comprise base barrier resistances which are formed in such a way that the base common to the partial power transistors extends from an active base region which lies below the zones forming the emitter for the partial power transistors, and has strip-shaped regions which project through bounded regions of the epitaxial layer which in each case, respectively, form a collector contact region for a partial power transistor and that the strip-shaped regions of the base zone on the side of the collector contact regions facing away from the emitter zone have a common base contact.

2. Power transistor arrangement according to claim 1 wherein, in the collector contact regions, doped zones are provided which project from the surface facing away from the semiconductor substrate and reach all the way into the buried layer zone, and serve to provide contact for the collector.

3. Integrated power transistor arrangement according to claim 1 wherein, the resistance value of the strip-shaped barrier resistances is determined by the length of the resistances taken in the direction toward the collector contact regions and wherein, the length is determined, respectively, by the distance between two collector contact regions.

* * * * *